United States Patent
Önlek

(10) Patent No.: US 11,914,095 B2
(45) Date of Patent: Feb. 27, 2024

(54) ASYNCHRONOUS METHOD FOR SAMPLING SIGNALS IN METAL DETECTORS

(71) Applicant: NOKTA MUHENDISLIK A.S., Sancaktepe/Istanbul (AR)

(72) Inventor: Mehmet Önlek, Tuzla/Istanbul (TR)

(73) Assignee: NOKTA MÜHENDISLIK A.S., Sancaktepe/Istanbul (TR)

( * ) Notice: Subject to any disclaimer, the term of this patent is extended or adjusted under 35 U.S.C. 154(b) by 344 days.

(21) Appl. No.: 17/297,642

(22) PCT Filed: Jan. 21, 2019

(86) PCT No.: PCT/TR2019/050044
§ 371 (c)(1),
(2) Date: May 27, 2021

(87) PCT Pub. No.: WO2020/153913
PCT Pub. Date: Jul. 30, 2020

(65) Prior Publication Data
US 2022/0011459 A1   Jan. 13, 2022

(51) Int. Cl.
*G01V 3/08* (2006.01)
*G01V 3/10* (2006.01)
*H03M 1/12* (2006.01)

(52) U.S. Cl.
CPC ............ *G01V 3/107* (2013.01); *H03M 1/125* (2013.01)

(58) Field of Classification Search
CPC .......... G01V 3/10; G01V 3/104; G01V 3/107; G01V 3/165
See application file for complete search history.

(56) References Cited

U.S. PATENT DOCUMENTS

| | | | |
|---|---|---|---|
| 5,055,784 A | 10/1991 | Jaeger et al. | |
| 5,525,907 A * | 6/1996 | Frazier | G01V 3/08 324/334 |

(Continued)

OTHER PUBLICATIONS

International Search Report and Written Opinion of the International Searching Authority for International Patent Application No. PCT/TR2019/050044 dated Feb. 7, 2020, 11 pages.

(Continued)

*Primary Examiner* — Thang X Le
(74) *Attorney, Agent, or Firm* — MERCHANT & GOULD P.C.

(57) ABSTRACT

This invention is related to the method providing computation of the signal frequency components in an acceptable accuracy in contravention of the shifts in the phase and the magnitude information caused by asynchronous sampling of the signals in the process of asynchronous sampling of metal detectors wherein the received signal by the receiver unit (4) divided into time intervals, say timing values those are far shorter than the sampling period and correspond to nearest probable sampling of the ADC (6); providing the computation of the sine and cosine coefficients or exponents of time constant coefficients of the said timing value from previously located or dynamically generated coefficient table; resulting the elimination of the requirement of synchronous sampling and the requirement of the signal period is multiple of the sampling period.

5 Claims, 2 Drawing Sheets

(56) References Cited

U.S. PATENT DOCUMENTS

| | | | |
|---|---|---|---|
| 7,579,839 B2 | 8/2009 | Candy | |
| 8,729,902 B1* | 5/2014 | Kelley | G01V 3/104 |
| | | | 324/323 |
| 9,429,674 B2* | 8/2016 | Wahrlich | G01V 3/10 |
| 2007/0242758 A1 | 10/2007 | Hoelzl et al. | |
| 2008/0100510 A1* | 5/2008 | Bonthron | G01S 13/89 |
| | | | 342/373 |
| 2010/0148781 A1* | 6/2010 | Candy | G01V 3/104 |
| | | | 324/329 |
| 2017/0299753 A1* | 10/2017 | Candy | G01V 3/105 |

OTHER PUBLICATIONS

O'Donoghue et al., "Low Cost Super-Nyquist Asynchronous Demodulation for Use in EM Tracking Systems", IEEE Transactions on Instrumentation and Measurement, 64(2): 458-466 (Feb. 2015).

* cited by examiner

ASYNCHRONOUS METHOD FOR SAMPLING SIGNALS IN METAL DETECTORS

CROSS-REFERENCE TO RELATED APPLICATIONS

This application is a National Stage Application of PCT/TR2019/050044, filed 21 Jan. 2019, and which application is incorporated herein by reference. To the extent appropriate, a claim of priority is made to the above-disclosed application.

TECHNICAL FIELD

This invention is related to a metal detector and the method of that metal detector which provides asynchronous sampling of voltage signals converted from a receiver unit using an analog to digital converter (ADC), originally generated by a single-frequency, multi-frequency or time-domain magnetic field composed by a transmitter unit, then providing calculation of signal components in acceptable accuracy in contravention of the shifts in the phase/time and magnitude information caused by asynchronous sampling of the signals.

PRIOR ART

Metal detectors are expected to detect the targets that are being searched in a fast and reliable manner. The ferromagnetic components of soil and other metallic objects can nevertheless cause false alarms.

While the false alarm rate is higher in single frequency metal detectors, this rate can be reduced in multi frequency metal detectors. Thanks to the multiple frequencies contained in the transmitted signals of multi-frequency metal detectors, the discriminating ability in returning signal increases and hence, rate of the false alarms decreases. The time-domain metal detectors have similar aspects with the single frequency and multi frequency relation when they apply patterns instead of a single rectangular pulse.

In the state of the art, some metal detectors operate at a single frequency but permit the user to select one of the frequencies previously set. The frequency selection is advantageous for discriminating dissimilar metallic targets in soils with various ferromagnetic properties. Nevertheless, the options of frequency remain quite yet to be sufficient in these detectors.

It is required in modern metal detectors that the analog signals those received from receiver unit to be sampled (digitized) in order to be processed and analyzed. The digitized said signal can be defined as the sampled signal obtained from multiple number of points of the analog signal in time.

Within this context, the first step in analog to digital conversion process is electrically acquiring the time variant magnetic field generated by the transmitter. This process takes place in switching components.

In the existing metal detectors, the switching process of the switching component is typically accomplished by a controller by synchronous sampling.

The voltage source that switched by the switching component is transferred to the transmitter unit and a magnetic field is generated proportional to the current by means of the transmitter coil. This magnetic field, also the target is located within, generates Eddy currents and causes regeneration of a magnetic field by the target. The magnetic field that has been regenerated by the target induces a voltage on the receiver coil and the signal reaches to the synchronous integrator unit through the receiver unit. The controller provides taking of the definite integral of the waveform of the signal in predetermined intervals by means of the control signals applied to the synchronous integrator unit. The definite integral of the signal is being digitized in sampling unit, say, the ADC (analog to digital converter). The controller computes in-phase and quadrature components of the sampled signal by timing synchronous to that of the transmitter, in corresponding phases and vectors consisting of two or more dimensions.

Another alternative of taking the definite integral by utilizing analog circuit components is the sample and hold (S/H) method. Using sample and hold method, the data is being computed to vectors by negligibly short intervals synchronously to the transmitter unit.

Within this operation, the ADC samples the signal in equal and repeating intervals (as $t_1, t_2, t_3, t_4, t_5, t_6, t_7 \ldots$ ). In case the full period of the signals is expressed as 360 degrees; the ADC, for instance in (FIG. 2), acquires the signal at $t_1$ corresponding to 0 degree, at $t_2$ corresponding to 120 degrees, at $t_3$ corresponding to 240 degrees. In the second period of the signal these timings will correspond exactly to $t_4, t_5, t_6$ and be 0 degree again at $t_7$. The sampling frequency of the ADC is required to be multiple of the frequency of the received signal in order for the vector to be calculated by the end of the operation. The more the speed of ADC rated to signal frequency the more samples can be gathered.

The computed values will be erroneous or shifted in phase or magnitude if the sampling intervals of the ADC are distinct from the regular sampling periods. Resultantly, the in-phase and quadrature components of the signal will be calculated discrepantly for each period.

The properties of sampling such as, the resolution of the ADC, the jitters in timing of the sampling are important for the performance of the method. These requirements limit the range of the ADC's selectable for suitable resolution and speed.

In the state of the art; the patent titled "Metal Detector" with reference U.S. Pat. No. 7,579,839 describes a metal detector which transmits a rectangular wave pattern and samples the signal in the receiver unit using "synchronous demodulators", providing the result by analyzing the samples. Synchronous demodulation; denotes that the analog signal voltage from the receiver unit is being processed synchronously to the transmitter.

The synchronous integrator; that has been described in the patent document with reference U.S. Pat. No. 7,579,839, obtains the definite integral in the electronic form by accumulating the electric charge on a capacitor by switching the voltage over that, in other words by simply averaging the voltage in a time interval within the period. Thanks to the method, the sampling process can be performed using a slower ADC by acquiring the averaged voltage on a capacitor. The requirement of the frequency of sampling dependency to the frequency of the signal is not essential because the synchronization of the signal to be sampled is provided by this synchronous demodulator. This solution causes additional electronic components to be used and as a result, an increase in the cost. The electronic components used, cause variation in performance of parameters depending to the temperature and aging, resultingly a variation between produced devices. The patent document referenced by U.S. Pat. No. 7,579,839 encloses the method of operation may subject to synchronization by said synchronized sampling, although it is not seemed to be directly related to "demodulation" concept.

The intervals of sampling of the signal by the ADC are predetermined within the period in the process of digitizing which is carried out by a digital synchronous receiver. Hence, it is also predetermined which time corresponds to each phase or angle. The values of sines and cosines of predetermined angles are usually stored in a table as coefficients in order to calculate the vectors in a faster manner. Thereafter, each sample is multiplied by the corresponding sine and cosine coefficients to separate it to the vectoral components. This method of operation can be expressed as a calculation method known as the Single Bin Discreet Fourier Transform (Single Bin DFT) below.

$$V_X[f] = \sum_{n=0}^{N-1} v[n] \cdot \cos\frac{2\pi n f}{f_s} \quad ve \quad V_Y[f] = \sum_{n=0}^{N-1} v[n] \cdot \sin\frac{2\pi n f}{f_s}$$

In the expression above; "$V_X[f]$ and $V_Y[f]$" are the components of the vector in X and Y axis at specified frequency, "N" is the total number of the samples acquired, "v[n]" is the sample acquired at sequence "n" in a period, "f" is the frequency of signal and "$f_s$" is the sampling frequency. The number N required to be relevant to the relation between signal frequency "f" and the sampling frequency "f". For instance; the number N can be selected as N=∥fs/f∥ in calculating the DFT after the period is completed. Here, the operator ∥ ∥ represents the round to the closest integer number. The sampling frequency is required to be multiple of the signal frequency and also all samples are required to cover the period of the lowest frequency component. The transformation either can be calculated separately for each frequency or calculated for all frequencies at once using a common algorithm, i.e. by Fast Fourier Transform (FFT) method.

The above formula; sin $$\sin\left[\frac{2\pi n f}{f_s}\right] \quad ve \quad \cos\left[\frac{2\pi n f}{f_s}\right],$$

values are coefficients for the DFT calculation.

These coefficients are located in a table aforementioned, can also be called as look-up table that is usually located in the memory of or attached to the computing unit in the design For example; the look-up table will contain 3 sine cosine pairs of values if the frequencies are f=1 kHz and fs=3 kHz. Similarly, the look-up table will contain 8 pairs of coefficients if the frequencies are f=1 kHz ve fs=8 kHz.

In case fs is the multiple off, the first sample of the signal will be acquired right at the same point of the repeating signal. Therefore; equal number of samples are acquired for each period. Within this context; the sine and cosine coefficients can be always selected from the predefined table in a correct form. The transmitter and receiver units of a system operating in this manner can be called "synchronous".

It cannot be expected that acquiring samples in the same number and from the same points during the each period of signal in case offs is not the multiple of the f'. Within this context, sine and cosine coefficients will be required at distinct points in the period. In this case; the phase information will shift at the end of each period. The transmitter and receiver units can be said "asynchronous" state in a system operating this way.

The phase information of a synchronous system is being measured repeatedly, without any alteration requirement of the coefficients. Despite, an asynchronous system can operate any frequency conforming the "Nyquist Criterion", but the phase information cannot be measured in same way because it varies for each period of the signal.

O'Donoghue Kilian Et Al. "Low Cost Super-Nyquist Asynchronous Demodulation for Use in EM Tracking Systems" discloses use of super-Nyquist sample rates in combination with an asynchronous demodulation scheme.

US2007242758A1 discloses an apparatus and associated method for identifying defects on objects provide for-under computer driving-the AC voltage energization of one transmitting coil to be simultaneously effected by a carrier signal, and for an essentially amplitude-modulated received signal to be received by means of at least one receiving coil; what is carried out, furthermore, is a demodulation not only of the carrier signal contained in the received signal by means of magnitude and phase formation, but also a demodulation of the harmonics of the carrier which are contained in the received signal, likewise by means of respectively associated magnitude and phase formation.

U.S. Pat. No. 5,055,784A discloses an eddy current measurement system. It is described and illustrated in which an eddy current probe is driven by a driving signal and voltage signals representing the current through and voltage across the probe coil are used to calculate the magnitude and phase angle of a complex probe impedance. Digitization of the voltage signals is controlled by a control logic system which is run separately from but initiated by a microprocessor, the latter of which functions to analyse the acquired data and calculate impedance magnitude and phase angle values therefrom.

Short Description of the Invention

The method related to the invention provides calculation of the phase by an acceptable accuracy using asynchronous sampling in contravention of shifts in the phase and magnitude information of the acquired signal. In order the computations can be accomplished, dynamic coefficients are used, providing signal phase information tracked much faster than the sampling speed, despite using look-up tables containing the sine and cosine coefficients according to a sampling frequency.

The objective of the invention is; sampling the received signal from the receiver unit using a fast and high-resolution ADC asynchronously and calculation of the in-phase and quadrature components with minimal error in a metal detector that generates the magnetic field in a form of sinusoidal or rectangular patterned waveform or a pulse train.

This invention eliminates the necessity of the signal period to be multiple of the sampling period of the ADC by means of a method, can devise asynchronous sampling. Thereby, the metal detector using asynchronous receiver can generate signal at any required frequency at the transmitter unit.

Thanks to the invention, the incoming signal can be analyzed in more detail by comparison with the synchronous sampling.

Another advantage of the invention is the elimination of additional electronic components, that may be used in case to provide a synchronization, resulting waste of power and electrical noise.

The invention provides opportunity of selection of the ADC from wider range in specifications for its resolution and speed. Within this context the advantage is the substitution of Sigma-Delta ADC's those are in a lower cost and with numerous options in resolutions and speed rather than the synchronous SAR ADC's (Successive Approximation Register Analog to Digital Converter).

The present invention is described in more detail by way of references, with reference to the figures and graphics listed below:

DESCRIPTION OF REFERENCE NUMBERS

Figure 1:
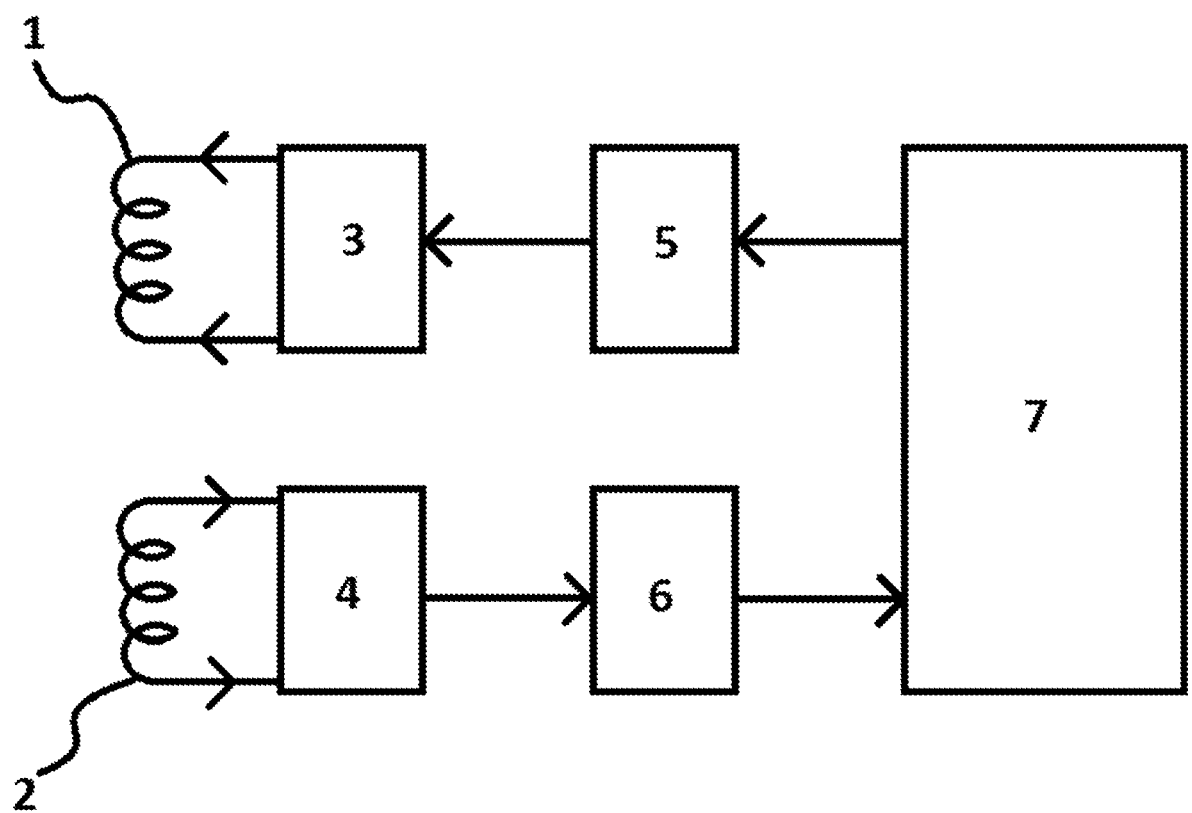
FIG. 1: Sample block diagram of a digital metal detector.

| NO | PART NAME |
|---|---|
| 1 | Transmitter Coil |
| 2 | Receiver Coil |
| 3 | Transmitter Unit |
| 4 | Receiver Unit |
| 5 | Switching Component |
| 6 | ADC |
| 7 | Controller |

DESCRIPTION OF THE INVENTION

This invention is related to the metal detector containing transmitter unit (3) generating a single frequency, multifrequency of pulsed magnetic field and providing the electrical reception of the magnetic field by the receiver unit (4) which is created at the target as a result of the field time-varying magnetic field generated by the transmitter unit (3) wherein; the signal received by the receiver unit (4) is sampled asynchronously relative to the transmitter unit by at least one ADC (6) (Analog to Digital Converter) and analyzed by the vectors of the sinusoidal components are obtained in this way.

Within the metal detector which the sampling is accomplished asynchronously; the switched signal generated by the controller (7) containing the multifrequency components is applied to the switching component (5). The voltage switched by the switching component (5) is applied to the transmitter unit (3) and a magnetic field is generated at the transmit coil (1) or around the transmit coil (1) which is proportional to the electric current flow. The magnetic field creates a current flow within the target and as a result, the current flow at the target generates a magnetic field and induces a voltage on the receiver coil (2) to be transferred to the ADC (6) through the receiver unit (4). The in-phase and quadrature components of the signal that is sampled asynchronously by the ADC (6) are computed by the controller (7). Same process is valid for the time-domain metal detectors such as pulse induction detectors were the phase components replaced with the exponential time constants.

The period of the sampled signal is not the multiple of the sampling period utilizing asynchronous digitization by the ADC (6). Accordingly, it is not predictable to determine the point that ADC (6) will sample the signal. Therefore, it is not useful that a predetermined sine and cosine table located in the controller (7) memory. Conversely, the greatest advantage of the asynchronous configuration is providing an opportunity to use a faster and high resolution ADC (6) at a bearable cost. Albeit, it is required to predetermine the time intervals between the asynchronous sampling and that of synchronized version in order to the asynchronous configuration can be applied (in order to be applied of the asynchronous configuration).

This invention provides the compensation of the probable shifts in measurements resulting from asynchronous sampling by means of the predetermination of the time intervals between asynchronous timing of the ADC (6) and that of synchronous version.

In the asynchronous signal sampling method of the invention; the controller (7) divides the multifrequency signal period into equal time intervals, based on the required resolution. The period of each said interval has a far less duration than sampling period and a digital record is located for each interval. The timing values can be tracked by modules such as a timer or a counter. A table is constructed as each location holds the sine and cosine coefficients of the corresponding time interval. The steps of the table correspond to the phase (angle) of corresponding time interval. The content of the table is depended to the frequency to be analyzed, therefore the table content is required to be constructed based on that frequency. The tables can be priorly constructed in case the frequencies are also predefined. The major difference to the prior art is, the tables are not defined corresponding to the sampling times but rather defined to probable time intervals that the sampling to be done.

If the sampling frequency is fs and the time gap is defined as $\Delta t$;

$$\Delta t = 1/fs$$

Above expression defines the time gap as the error caused by the sampling frequency. Same equation can be used to express the timing error as the "accurate timing" concept in case of the ADC sampling speed increases. Within this context, in the following expression;

$$\Delta t' = 1/(Mfs)$$

"M" stands for the interval timing precision of the samples acquired by the ADC (6) where M>1. The said timing values are used to track the phase change of the asynchronously sampled signal. Resultingly, a M*N size table that containing the sine and cosine coefficients, is constructed, where N is the total number of samples within a signal period. The timing value can be used to index the sine and cosine coefficients from the table in ratio of the value at the end of the signal period. Finally, the vectoral components are obtained by multiplying the sine and cosine coefficients by the corresponding sampled values. Within this context; the sensitivity of the result of calculations increases with the resolution of sampling.

Figure 2:
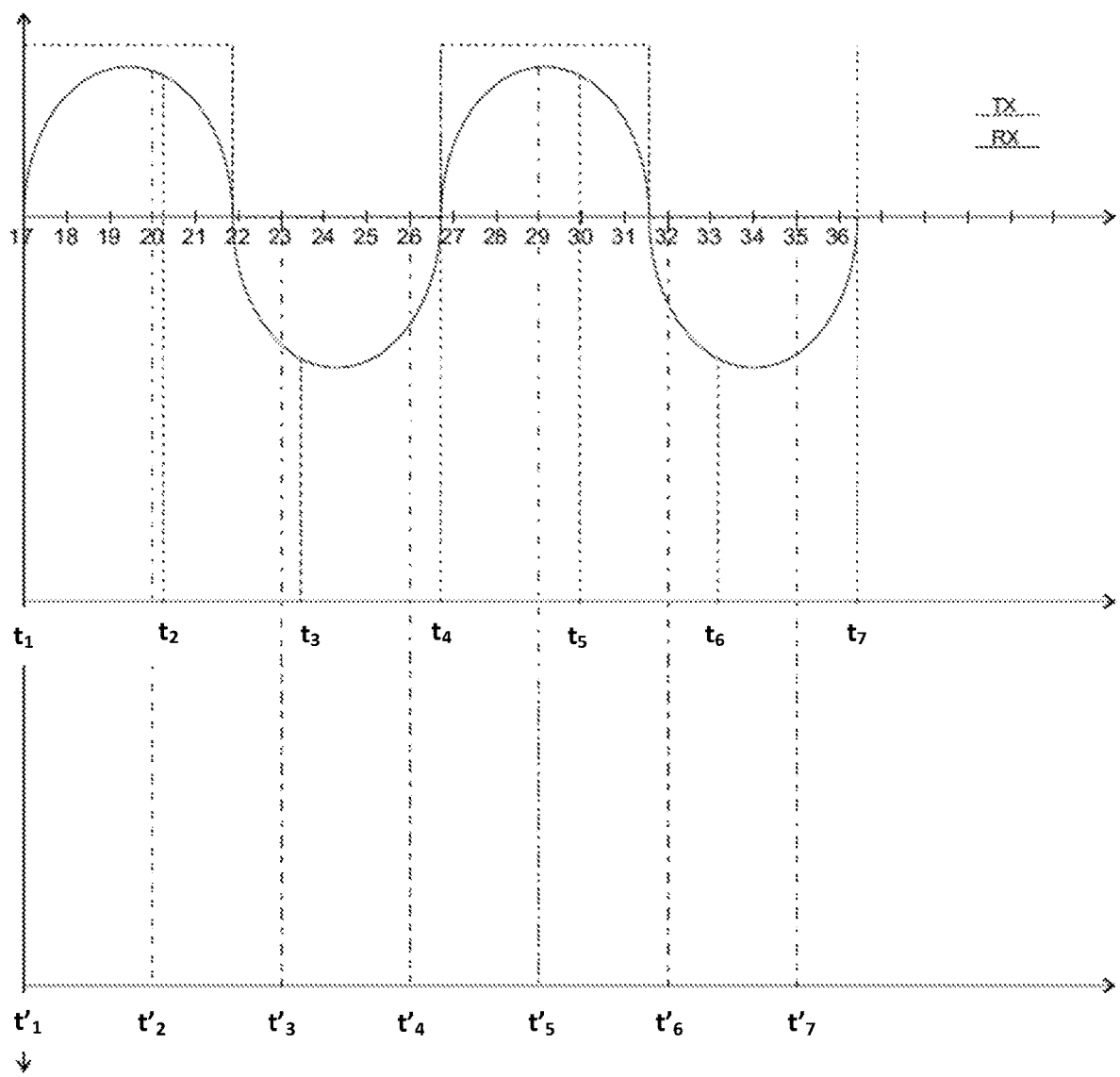
FIG. 2: The graphical representation of the sample timing of the received signal. The ($t_n$) timings point to the samples synchronously acquired whereas ($t'_n$) point to the timing of asynchronous samples. The numbers 17, 18, 19, 20 . . . 36 depict the counter values of the timing.

The said asynchronous sampling system described by FIG. 2; the ADC (6) samples the received signal at the instants of $t'_1$, $t'_2$, $t'_3$, $t'_4$, $t'_5$, $t'_6$, $t'_7$ . . . with equal or unequal sampling intervals but non-coherently to the repeating signal. In the asynchronous sampling part of FIG. 2, the ADC (6) samples the 0 degree at $t'_1$, 111 degree at $t'_2$, 221 degree at $t'_3$ and 332 degree at $t'_4$ at the first period. In the second period, ADC (6) samples 83 degree at $t'_5$, 193 degree at $t'_6$ and 304 degree at $t'_7$. As seen in the example, the ADC (6) samples the signal asynchronously, by equal intervals but not corresponding to same degrees in following two periods. This case results measurement of the phase of the sampled signal different from the other in each signal period. In the method of the invention; the phase shift is tracked by the controller (7) and used for the computation. The controller (7) takes reference timing values while it applies the reference signal to the switching component (5) generated using the transmitter unit (3). In the method of invention; the signal is divided into smaller time intervals (Δt'). The said time intervals are depicted as 17, 18, ... 36 in FIG. 2. The reference timing values indexes the time intervals as 0, 1, 2, ... 19 and provides a calculation of the corresponding phase (angle) values. The timing values can be tracked by modules such as a timer or a counter. The phase (angle) value is calculated in each sampling of the ADC (6) according to the reference timing value. Thanks to the referenced timing; the synchronization shift of the ADC (6) sampling to the received signal is determined as well as the phase shifts because of the asynchronous sampling.

This invention is a method of; sampling of the signal by at least one ADC's (6) which received through a receiver unit (4), generated as a result of the reaction of the target to the magnetic field generated by a transmitter unit (3); and utilization of a DFT based transformation technique consisting of the summing of the samples each multiplied by the coefficients corresponding to the timing within the period in order to be expressed in terms of components of phase/magnitude or time constants in order to obtain the information for the target presence and/or the target kind for the metal detectors. In addition to the synchronous methods in the state of the art, the invention provides asynchronously sampling by following steps;

Defining the nearest timing of the each acquired sample from the table/array by using the transformation table/array which is defined for the timing intervals that are smaller than or equal to the sampling intervals of the ADC (6) and multiplying the coefficients corresponding to the defined time with the acquired samples.

Phase/magnitude and/or time constant components of targets are obtained in acceptable accuracy by using the sum of the asyncronously acquired samples, each multiplied by the corresponding coefficient.

In the preferred embodiment; the timing values are generated by internal counters within the processor. The size of the said sine and cosine coefficients table and the speed of the said counters (number of the timing values) varies with the required resolution and frequency spectrum to be analyzed.

In the preferred embodiment, the detector is a multifrequency VLF continuous wave (CW) detector while all described analogy can be applied to time-domain detectors operating by pulse induction method or any hybrid methods by time-domain analysis with replacement of sine and cosine coefficient tables to corresponding time domain analysis coefficients and expressing them as superposed series of exponentials of time constants.

The invention claimed is:

1. A method for obtaining information related to a target presence and/or a target kind for metal detectors, the method comprising:
    sampling a signal by at least one Analog to Digital Converter (ADC) which is received through a receiver unit wherein said signal is generated as a result of a reaction of said target to a magnetic field transmitted by a transmitter unit;
    by a controller, utilizing a Discreet Fourier Transform (DFT) based transformation technique consisting of summing of samples where each sample is multiplied by coefficients corresponding to a timing within a period in order to be expressed in terms of components of phase/magnitude or time constants for obtaining said information;
    by said controller, providing the transmitter unit to transmit a reference signal where said reference signal is divided into time intervals where said time intervals are indexed by reference timing values;
    by the controller, providing the receiver unit to receive and the ADC to sample said reference signal;
    by the controller, detecting a phase shift for each sampling of the ADC according to a reference timing value;
    by the controller, updating a table, the table defined for the timing intervals that are smaller than or equal to sampling intervals of the ADC and multiplying coefficients corresponding to a defined time with acquired samples,
    by the controller, providing the transmitter unit to transmit a signal for detection,
    by the controller, providing the receiver unit to receive and the ADC to sample said signal,
    by the controller, defining nearest timing of each acquired sample from the table by using said table and determining corresponding coefficients for each sample; and
    by the controller, obtaining phase/magnitude and/or time constant components of targets by using the sum of the asynchronously acquired samples, each multiplied by the corresponding coefficient.

2. The method according to claim 1, wherein the said metal detector operates one of single frequency, multifrequency, and time-domain methods.

3. The method according to the claim 1, wherein the table on an internal or external memory of the processor is used for locating sine and cosine coefficients corresponding to each timing value or determined by calculation, dynamically.

4. The method according to the claim 3, wherein the time constants coefficients are located in the table in the memory when using time-domain, say pulse induction method.

5. The method according to the claim 1, wherein the computing, timing or signal conversion processes are accomplished by at least one microcontroller, at least a digital signal processor (DSP) and/or at least one FPGA.

* * * * *